(12) United States Patent
Jeong et al.

(10) Patent No.: US 9,941,423 B2
(45) Date of Patent: Apr. 10, 2018

(54) METHOD FOR MANUFACTURING THIN FILM SOLAR CELL

(71) Applicant: Korea Institute of Science and Technology, Seoul (KR)

(72) Inventors: Jeung-hyun Jeong, Seoul (KR); Won Mok Kim, Seoul (KR); Jong-Keuk Park, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 14/803,843

(22) Filed: Jul. 20, 2015

(65) Prior Publication Data

US 2016/0126376 A1   May 5, 2016

(30) Foreign Application Priority Data

Oct. 31, 2014   (KR) ........................ 10-2014-0150130

(51) Int. Cl.
*H01L 21/00* (2006.01)
*H01L 31/0463* (2014.01)
(Continued)

(52) U.S. Cl.
CPC .. *H01L 31/022425* (2013.01); *H01L 31/0463* (2014.12); *H01L 31/0749* (2013.01); *Y02E 10/541* (2013.01); *Y02P 70/521* (2015.11)

(58) Field of Classification Search
CPC ....... H01L 31/02167; H01L 31/022466; H01L 31/022475; H01L 31/022483;
(Continued)

(56) References Cited

U.S. PATENT DOCUMENTS

| 6,974,976 B2 | 12/2005 | Hollars |
| 2005/0248824 A1* | 11/2005 | Fukazawa ............ G02F 1/1523 359/265 |

(Continued)

FOREIGN PATENT DOCUMENTS

| KR | 10-0743923 B1 | 7/2007 |
| KR | 10-2011-0101349 A | 9/2011 |

(Continued)

OTHER PUBLICATIONS

Nakada, Tokio. "Microstructural and diffusion properties of CIGS thin film solar cells fabricated using transparent conducting oxide back contacts." Thin Solid Films 480 (2005): 419-425.

(Continued)

*Primary Examiner* — Duy T Nguyen
(74) *Attorney, Agent, or Firm* — NSIP Law

(57) ABSTRACT

A method for manufacturing a thin film solar cell includes: depositing a transparent first rear electrode on a first surface of a transparent substrate; depositing a second rear electrode having a high-conductive metal on the first rear electrode; performing a first laser scribing process to separate a double layer of the first and second rear electrodes; depositing a light absorption layer having selenium (Se) or sulfur (S) on the second rear electrode; performing a second laser scribing process by inputting a laser to a second surface of the transparent substrate to separate the light absorption layer; depositing a transparent electrode on the light absorption layer; and performing a third laser scribing process by inputting a laser to the second surface to separate the transparent electrode. Accordingly, patterning may be performed in a substrate-incident laser manner to improve price, productivity and precision of the patterning process.

19 Claims, 12 Drawing Sheets

(51) Int. Cl.
*H01L 31/0224* (2006.01)
*H01L 31/0749* (2012.01)

(58) Field of Classification Search
CPC ......... H01L 31/022491; H01L 31/0326; H01L 31/03923; H01L 31/0445; H01L 31/18; H01L 31/1884; H01L 31/022425; H01L 31/0463; H01L 31/0749; Y02E 10/541; Y02P 70/521
USPC .......................................................... 438/57
See application file for complete search history.

(56) References Cited

U.S. PATENT DOCUMENTS

| | | |
|---|---|---|
| 2012/0006385 A1 | 1/2012 | Hassan et al. |
| 2013/0014800 A1* | 1/2013 | Stephens ............. H01L 31/0463 136/244 |
| 2013/0168797 A1 | 7/2013 | Rekow |
| 2013/0255760 A1* | 10/2013 | Kim ................... H01L 31/0468 136/256 |

FOREIGN PATENT DOCUMENTS

| | | |
|---|---|---|
| KR | 10-2012-0086217 A | 8/2012 |
| KR | 10-2012-0111366 A | 10/2012 |
| KR | 10-2013-0120538 A | 11/2013 |
| WO | WO 2012/102453 A1 | 8/2012 |

OTHER PUBLICATIONS

Simchi, Hamed, et al. "Structure and interface chemistry of MoO3 back contacts in Cu (In, Ga) Se2 thin film solar cells." Journal of Applied Physics 115.3 (2014): 033514 (9 pages).

* cited by examiner

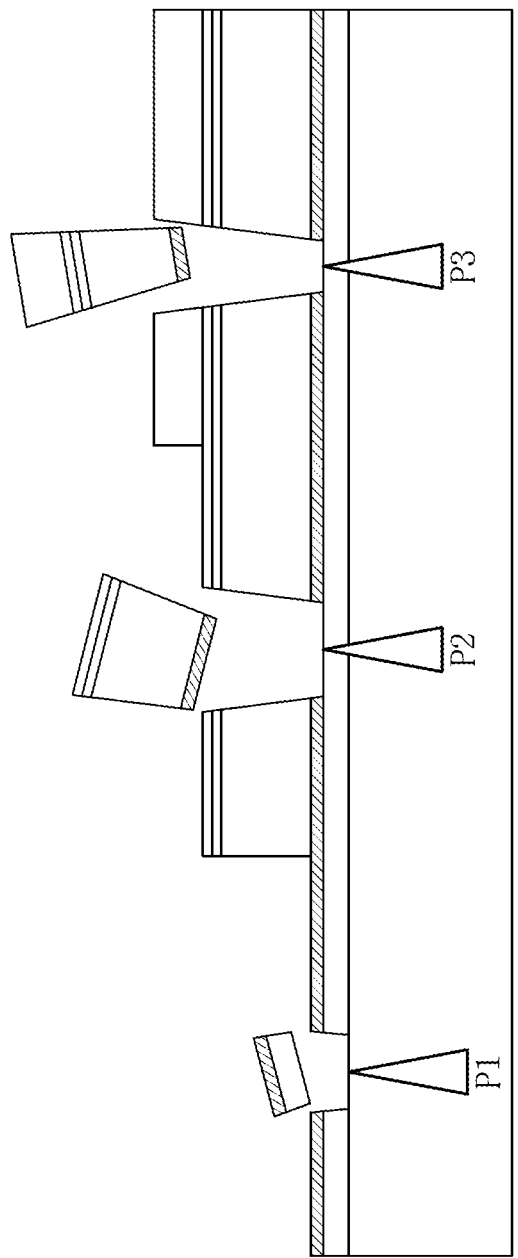

METHOD FOR MANUFACTURING THIN FILM SOLAR CELL

CROSS-REFERENCE TO RELATED APPLICATION

This application claims priority to Korean Patent Application No. 10-2014-0150130, filed on Oct. 31, 2014, and all the benefits accruing therefrom under 35 U.S.C. § 119, the contents of which in its entirety are herein incorporated by reference.

BACKGROUND

1. Field

The present disclosure relates to a method for manufacturing a thin film solar cell and a module structure of a thin film solar cell, and more particularly, to a method for manufacturing a thin film solar cell and a module structure of a thin film solar cell, in which a substrate-incident laser is applied in a scribing process of a thin film solar cell.

2. Description About National Research and Development Support

This study was supported by the Source Technology Development for the Convergence of Renewable Energy program of Ministry of Trade, Industry & Energy, Republic of Korea (Project No. 1415132283) under the superintendence of Korea Institute of Science and Technology.

3. Description of the Related Art

A Se-based or S-based thin film solar cell made of $Cu(In_{1-x}, Ga_x)(Se,S)_2$ (CIGS) or $Cu_2ZnSn(Se,S)_4$ (CZTS) is prepared by depositing molybdenum (Mo) on a glass substrate, a metal substrate or a polymer substrate as a rear electrode, then forming a CIGS thin film (or, a CZTS thin film) as a p-type light absorption layer, and successively depositing a CdS thin film (or, ZnS, $In_2S_3$) as a buffer layer, an intrinsic ZnO (or, ZnMgO) as a high-resistive window layer and a transparent conductive oxide (TCO) electrode as an n-type window layer. In comparison to an existing silicon solar cell, the Se-based or S-based thin film solar cell allows reduction of production costs due to its thin film manufacturing and high photovoltaic conversion efficiency (PCE) of 20% or above, and thus this is evaluated as a potential candidate in the next-generation solar cell market.

As an advantage in manufacturing a module of a thin film solar cell, the module may allow for monolithic integration with a structure depicted in FIG. 1. When manufacturing the thin film solar module, each unit cell is isolated by performing a first patterning process P1 to a Mo rear electrode, performing a second patterning process P2 after deposition of CIGS/CdS/i-ZnO, and performing a third patterning process P3 after deposition of TCO, and adjacent cells are electrically connected in series through a TCO/Mo connection of the area of the second patterning process P2. FIG. 1 shows a part of the entire module in which three cells are connected in series for example, and the monolithically integrated module is configured by iteratively forming the structure of FIG. 1 with a serial connection.

FIG. 2 is a diagram showing a preparation process for forming an existing module structure of CIGS thin film solar cell. First, after a molybdenum (Mo) rear electrode is deposited to a substrate, the rear electrode is electrically isolated through the first patterning process P1 using a laser scriber. After a light absorption layer, a CdS buffer layer and an i-ZnO layer are deposited thereon, they are removed through the second patterning process P2 using a mechanical or laser scriber exposing the surface of the rear electrode. After a transparent electrode layer is deposited, it is electrically isolated through the third patterning process P3 using a mechanical or laser scriber. At this time, in the area of the second patterning process P2, the TCO layer serving as an upper electrode and Mo serving as a rear electrode come into contact with each other, thereby connecting the adjacent cells in series.

The mechanical scriber applied to the second patterning process P2 and the third patterning process P3 needs somewhat low equipment costs in comparison to the laser scriber. However, except for this, this mechanical scriber has a disadvantage of causing a problem in productivity due to an increase of defective products since scribing width and quality is degraded by an abrasion of a scribing tip during a module manufacturing process, and thus the tip should be exchanged frequently, thereby increasing the manufacturing costs. In addition, when patterning is performed by means of mechanical scribing, it is very difficult to decrease a line width to a certain level or below, and thus a dead area where a photocurrent cannot be collected increases, thereby decreasing a power amount generated by the module.

To solve this problem, it is needed to develop a technique capable applying a laser scriber to the second patterning process P2 and the third patterning process P3. Compared with the first patterning process P1, in case of the second patterning process P2 and the third patterning process P3, laser is incident from a transparent window layer. At this time, in order to decrease a loss of the Mo rear electrode, the heat transfer to the Mo rear electrode caused by laser heating should be restrained. For this, an expensive pulse laser source having a pulse width of below several ten picoseconds (ps) should be applied.

In addition, reaction products on the Mo surface, which may be generated when a CIGS thin film is removed by laser heating, increase a resistance of the TCO/Mo contact in the area of the second patterning process P2, which in turn increases a series resistance of the module. In addition, debris, ridges, or burs generated during the scribing process may cause shunting among cells or irregularity in following thin film deposition.

The photovoltaic module has extended its market beyond the traditional solar energy generation plants for large-scale electricity production, into a building-integrated photovoltaic module (BIPV), a vehicle-integrated photovoltaic module (VIPV) for a vehicle such as a car or a bus, a device-integrated photovoltaic module (DIPV) for a device with portability. Among them, the building-integrated photovoltaic module (BIPV) may be applied to a roof, a wall and a window of a building, among which the window-type photovoltaic module needs light transmission to a certain level for lighting.

An amorphous thin film Si solar cell removes a light absorption layer by means of laser scribing to ensure transparency, and a crystalline Si wafer solar cell ensures transparency by using a gap to which cells are not applied, thereby meeting their demands. Since persons inside the building are sensitive to the color of the light transmitted through a window in an aesthetic aspect, such a transparent photovoltaic module should be able to provide an option for tuning the wavelength and intensity of the light transmitted through it.

SUMMARY

The present disclosure is directed to providing a method for manufacturing a thin film solar cell, which may improve a cost competence, productiveness and preciseness of a scribing process by allowing patterning by a substrate-incident laser.

The present disclosure is also directed to providing a module structure of a thin film solar cell, which may help improve PCE, productivity and functionality.

In one aspect, there is provided a method for manufacturing a thin film solar cell, which includes: depositing a transparent first rear electrode on a first surface of a transparent substrate; depositing a second rear electrode having a high-conductive metal on the first rear electrode; performing a first laser scribing process to separate a double layer of the first and second rear electrodes; depositing a light absorption layer having selenium (Se) or sulfur (S) on the second rear electrode; performing a second laser scribing process by inputting a laser to a second surface of the transparent substrate, which is opposite to the first surface, to separate the light absorption layer; depositing a transparent electrode on the light absorption layer; and performing a third laser scribing process by inputting a laser to the second surface to separate the transparent electrode.

In an embodiment of the present disclosure, in the performing of a second laser scribing process and the performing of a third laser scribing process, the second rear electrode may be used as a sacrificial layer for removing the layers subsequently placed on the second rear electrode.

In an embodiment of the present disclosure, the first rear electrode may be made of a material having a light absorptance of 20% or below in a visible or near infrared light band and a specific resistance of 1E-2 $\Omega$cm or below.

In an embodiment of the present disclosure, the first rear electrode may include any one selected from the group consisting of a transparent conductive oxide (TCO) having at least one of an indium oxide, a zinc oxide and a tin oxide, a multilayered transparent electrode composed of a TCO and a metal film or a nano-wire layer and a TCO, and a transparent electrode in which a carbon material having at least one of graphene and carbon nanotube is dispersed.

In an embodiment of the present disclosure, the second rear electrode may be made of a material having a specific resistance of 5E-5 $\Omega$cm or below and also having a wavelength band in which a ratio of a light absorptance of the second rear electrode to a light absorptance of the first rear electrode is more than 1 in a visible or near infrared light band.

In an embodiment of the present disclosure, the second rear electrode may be formed with a single layer or multiple layers including at least one metal selected from molybdenum (Mo), tungsten (W), titanium (Ti), copper (Cu), gold (Au), silver (Ag), niobium (Nb) and nickel (Ni).

In an embodiment of the present disclosure, the first rear electrode may be formed to have a thickness of 50 to 1000 nm, and the second rear electrode may be formed to have a thickness of 10 to 1000 nm.

In an embodiment of the present disclosure, the light absorption layer may be made of a material including at least one of copper (Cu) and silver (Ag), at least one of indium (In), gallium (Ga), aluminum (Al), zinc (Zn) and tin (Sn), and at least one of selenium (Se) and sulfur (S).

In an embodiment of the present disclosure, the method for manufacturing a thin film solar cell may further include depositing at least one of a buffer layer and a high-resistive window layer on the light absorption layer, and the at least one layer may be removed together with the light absorption layer when the second laser scribing process is performed.

In another aspect of the present disclosure, there is provided a method for manufacturing a thin film solar cell, which includes: depositing a transparent rear electrode on a first surface of a transparent substrate; performing a first laser scribing process to separate the rear electrode; depositing a light absorption layer having selenium (Se) or sulfur (S) on the rear electrode; performing a second laser scribing process by inputting a laser to a second surface of the transparent substrate, which is opposite to the first surface, to separate the light absorption layer; depositing a transparent electrode on the light absorption layer; and performing a third laser scribing process by inputting a laser to the second surface to separate the transparent electrode.

In an embodiment of the present disclosure, the rear electrode may be made of a material having a light absorptance of 20% or below in a visible or near infrared light band and a specific resistance of 1E-2 $\Omega$cm or below.

In an embodiment of the present disclosure, the rear electrode may include any one selected from the group consisting of a transparent conductive oxide (TCO) having at least one of an indium oxide, a zinc oxide and a tin oxide, a multilayered transparent electrode composed of a TCO and a metal film or a nano-wire layer and a TCO, and a transparent electrode in which a carbon material having at least one of graphene and carbon nanotube is dispersed.

In an embodiment of the present disclosure, the depositing of a transparent rear electrode on a first surface of a transparent substrate may further include depositing an interface control substance on the rear electrode.

In an embodiment of the present disclosure, the interface control substance may be made of a material which is stable at temperature of 400 to 600° C. and has a work function of 5 eV or above.

In an embodiment of the present disclosure, the interface control substance may include at least one of molybdenum oxide, tungsten oxide, nickel oxide and chrome oxide.

In an embodiment of the present disclosure, the rear electrode may be formed to have a thickness of 100 to 2000 nm, and the interface control substance may be formed to have a thickness of 1 to 50 nm.

In an embodiment of the present disclosure, the light absorption layer may be made of a material including at least one of copper (Cu) and silver (Ag), at least one of indium (In), gallium (Ga), aluminum (Al), zinc (Zn) and tin (Sn), and at least one of selenium (Se) and sulfur (S).

In an embodiment of the present disclosure, the method for manufacturing a thin film solar cell may further include depositing at least one of a buffer layer and a high-resistive window layer on the light absorption layer, and the at least one layer may be removed together with the light absorption layer when the second laser scribing process is performed.

In another aspect of the present disclosure, there is provided a module structure of a thin film solar cell, which includes: a first rear electrode having transparency and formed on a transparent substrate; a second rear electrode having a high-conductive metal and formed on the first rear electrode; a light absorption layer having selenium (Se) or sulfur (S) and formed on the second rear electrode; at least one of a buffer layer and a high-resistive window layer formed on the light absorption layer; and a transparent electrode formed on the at least one layer, wherein a double layer of the first rear electrode and the second rear electrode is separated at regular intervals in a first direction, wherein the second rear electrode, the light absorption layer and the at least one layer are separated in the first direction in a region adjacent to a separation area of the double layer, and wherein the second rear electrode, the light absorption layer, the at least one layer and the transparent electrode are separated in the first direction.

In an embodiment of the present disclosure, the first rear electrode and the transparent electrode may be connected in series in a region where the second rear electrode, the light absorption layer and the at least one layer is separated.

In an embodiment of the present disclosure, the first rear electrode may be made of a material having a light absorptance of 20% or below in a visible or near infrared light band and a specific resistance of 1E-2 Ωcm or below.

In an embodiment of the present disclosure, the first rear electrode may include any one selected from the group consisting of a transparent conductive oxide (TCO) having at least one of an indium oxide, a zinc oxide and a tin oxide, a multilayered transparent electrode composed of a TCO and a metal film or a nano-wire layer and a TCO, and a transparent electrode in which a carbon material having at least one of graphene and carbon nanotube is dispersed.

In an embodiment of the present disclosure, the first rear electrode may be formed to have a thickness of 50 to 1000 nm.

In an embodiment of the present disclosure, the second rear electrode may be made of a material having a specific resistance of 5E-5 Ωcm or below and also having a wavelength band in which a ratio of a light absorptance of the second rear electrode to a light absorptance of the first rear electrode is more than 1 in a visible or near infrared light band.

In an embodiment of the present disclosure, the second rear electrode may be formed with a single layer or multiple layers including at least one metal selected from molybdenum (Mo), tungsten (W), titanium (Ti), copper (Cu), gold (Au), silver (Ag), niobium (Nb) and nickel (Ni).

In an embodiment of the present disclosure, the light absorption layer may be made of a material including at least one of copper (Cu) and silver (Ag), at least one of indium (In), gallium (Ga), aluminum (Al), zinc (Zn) and tin (Sn), and at least one of selenium (Se) and sulfur (S).

In an embodiment of the present disclosure, the second rear electrode may be formed to have a thickness of 10 to 1000 nm.

If the method and module structure for manufacturing a thin film solar cell as described above is used, by applying a transparent material with excellent transmittance to a surface of a transparent substrate as a rear electrode, which is close to the substrate, a substrate-incident laser may be applied to a scribing process for modularizing a thin film solar cell. Accordingly, a light absorption layer including copper-indium-gallium-selenide (CIGS) may be released from the rear electrode due to rapid thermal expansion at the interface, which may improve productivity and preciseness of the process.

In addition, since the light absorption layer may be removed just with relatively low-temperature heating, an expensive laser such as a pulse laser of picoseconds (ps) or femtoseconds (fs) may not be used to prevent heat diffusion to surroundings, caused by severe heat accumulation. Therefore, the CIGS solar cell module may be manufactured using an inexpensive nanosecond (ns) pulse laser scriber, which may reduce the manufacture costs.

Moreover, if a double-layered rear electrode of a metal layer and a transparent material layer is applied, an interference (formation of reaction products or imperfect adhesion) with the transparent material may be prevented during the CIGS deposition, which allows high-efficient product of solar cells, different from the case where only a transparent material is used for the rear electrode. In addition, an electric resistance of the rear electrode may be greatly lowered by the introduction of the metal layer, which may prevent an increase of electric resistance when the transparent material layer is used.

In addition, since the metal layer may be used as a sacrificial layer in the metal layer/transparent material layer during a laser scribing process, when a second patterning process P2 and a third patterning process P3 are applied, patterning may be performed without directly applying a laser to the CIGS light absorption layer, and it is possible to ensure transmittance since the metal layer is removed together.

Further, since a reflected light interference phenomenon occurs due to an indoor light source at a surface of the metal layer/transparent material layer, the transparent material layer/glass substrate, or the glass substrate, a color may be endowed to a window-type photovoltaic module in view of an indoor dweller by adjusting a distance between interfaces of the rear electrode, which may give an aesthetic effect.

BRIEF DESCRIPTION OF THE DRAWINGS

FIG. 6 is a diagram for illustrating a concept of laser scribing according to first to third patterning processes in the thin film solar cell module of FIG. 5.

DETAILED DESCRIPTION

Figure 1:
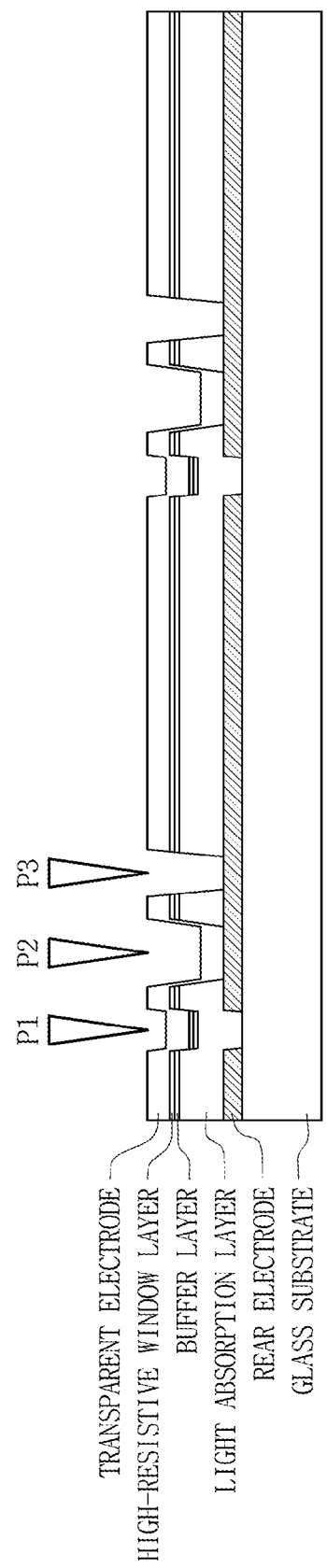
FIG. 1 is a cross-sectional view showing a monolithically integrated thin film solar cell module to which an existing Mo rear electrode is applied.
Figure 2:
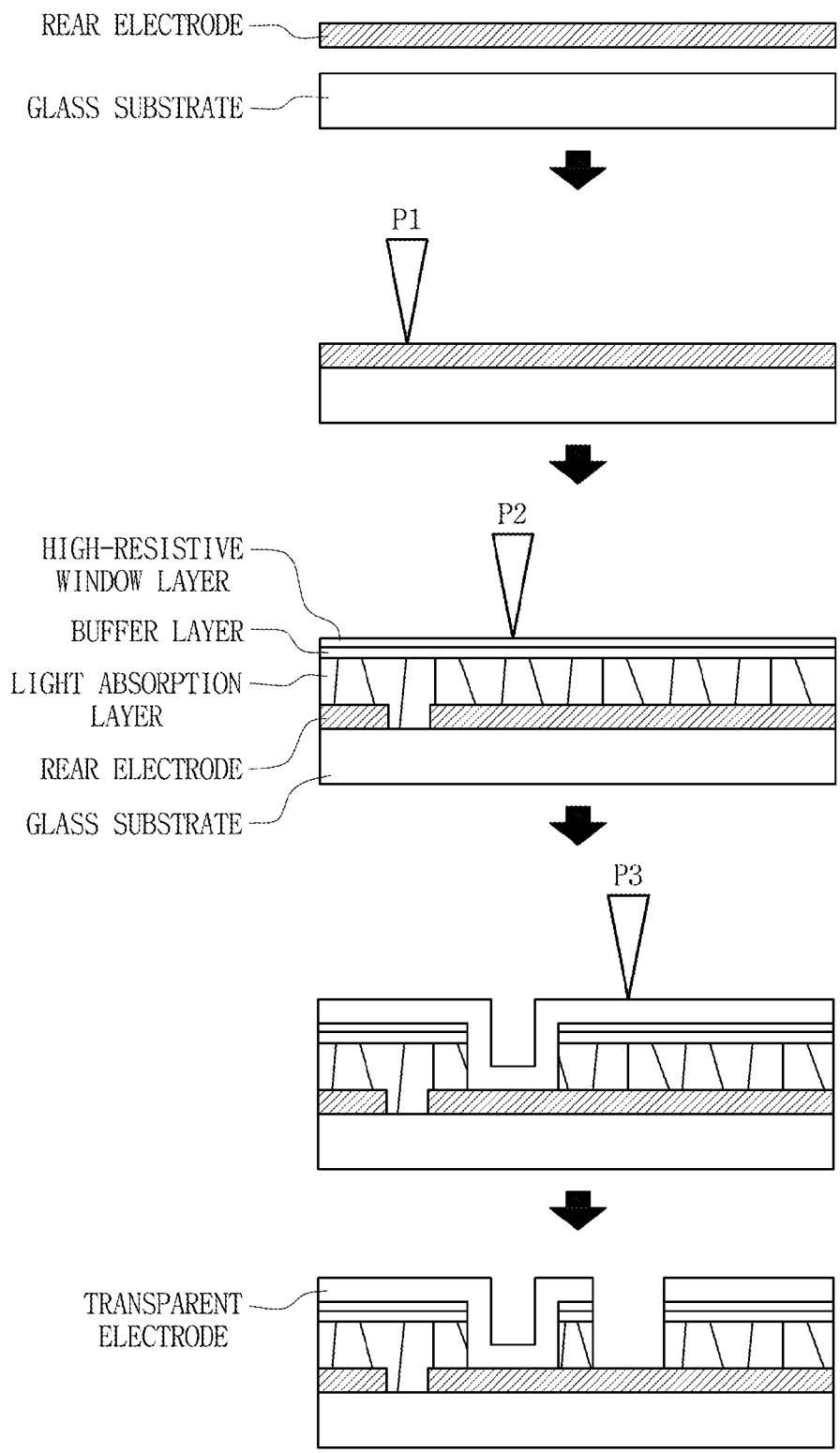
FIG. 2 is a cross-sectional view for illustrating a manufacturing method of the existing thin film solar cell module, depicted in FIG. 1.

The following detailed description of the present disclosure refers to the accompanying drawings which show specific embodiments implemented by the present disclosure. These embodiments are described in detail so as to be easily implemented by those skilled in the art. It should be understood that various embodiments of the present disclosure are different from each other but not exclusive from each other. For example, specific shapes, structures and features written herein can be implemented in other embodiments without departing from the scope of the present disclosure. In addition, it should be understood that locations or arrangements of individual components in each embodiment may be changed without departing from the scope of the present disclosure. Therefore, the following detailed description is not directed to limiting the present disclosure, and the scope of the present disclosure is defined just with the appended claims along and their equivalents, if it is suitably explained. In the drawings, like reference numerals denote like elements through several drawings.

Hereinafter, embodiments of the present disclosure will be described in detail with reference to the accompanying drawings.

Figure 3:
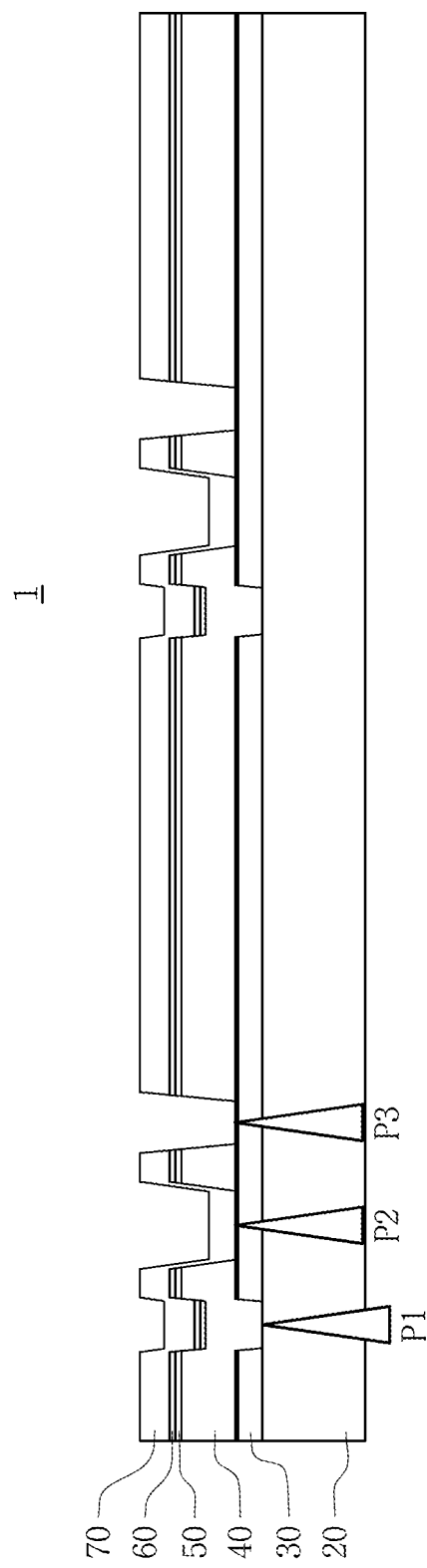
FIG. 3 is a cross-sectional view showing a module structure of a thin film solar cell according to an embodiment of the present disclosure, which is composed of rear electrodes with excellent transmittance to allow transmission of a substrate-incident laser.
Figure 4:
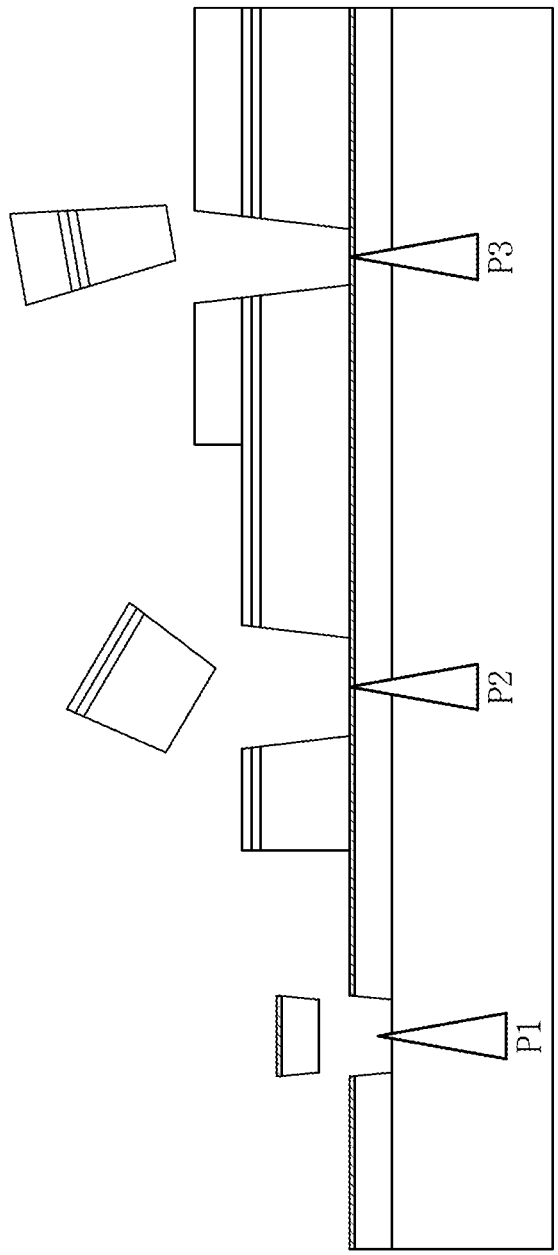
FIG. 4 is a diagram for illustrating a concept of laser scribing according to first to third patterning processes in the thin film solar cell module of FIG. 3.

FIG. 3 is a cross-sectional view showing a module structure of a thin film solar cell according to an embodiment of the present disclosure, which is composed of electrodes with excellent transmittance to allow transmission of a substrate-incident laser, and FIG. 4 is a diagram for illustrating a concept of laser scribing according to first to third patterning processes in the thin film solar cell module of FIG. 3.

Referring to FIG. 3, a thin film solar cell 1 according to the present disclosure is configured so that a rear electrode 30 with transparency, a Se-based or S-based light absorption layer 40 made of $Cu(In_{1-x}Ga_x)(Se,S)_2$ (CIGS) or $Cu_2ZnSn(Se,S)_4$ (CZTS), at least one of a buffer layer 50 and a high-resistive window layer 60, and a transparent electrode 70 are deposited on a first surface of a transparent substrate 10 and monolithically integrated.

In the present disclosure, in order to form a structure in which a plurality of separated cells of the thin film solar cell 1 are connected in series, when patterning is performed to partially remove the stacked layers, a laser is input to a lower portion of the transparent substrate 10. In other words, different from an existing technique in which a laser is input to a first surface where a transparent electrode or the like is integrated, a laser is input to a second surface of the transparent substrate 10, which is opposite to the first surface, to perform the scribing process.

For example, in order to form the thin film solar cell 1, a first scribing process P1 for separating the rear electrode 30 in one direction in parallel, a second scribing process P2 for separating the light absorption layer 40 in a region adjacent to an area where the rear electrode 30 is separated, and a third scribing process P3 for separating the transparent electrode and at least one layer lower than the transparent electrode together may be performed.

When at least one scribing process P1, P2, P3 is performed, if a laser with a wavelength, which is absorbable to a material to be removed but not absorbable to the transparent substrate 10, is input to the transparent substrate 10, the layer may be separated from an interface due to a focused stress by abrupt thermal expansion without melting the material to be removed, which allows scribing just with small energy.

In addition, since a laser incident direction and a debris removal direction are entirely distinguished, problems such as reabsorption of debris are not generated at all. Further, since a melting process is not necessary, incident energy is low and thermal expansion does not give a serious problem, which makes it unnecessary to use a pulse laser of picosecond (ps) or below. Accordingly, a relatively inexpensive nanosecond (ns) laser may be applied.

In an existing CIGS solar cell module, since a molybdenum (Mo) rear electrode traditionally used is oblique to a laser, there is no way of applying a substrate-incident laser method to remove only a CIGS light absorption layer, a buffer layer and a transparent window layer formed on a Mo rear electrode during the second and third scribing processes while preserving the Mo rear electrode.

In the present disclosure, even though a transparent material is applied to the rear electrode 30, efficiency deterioration caused by substitution of a rear electrode (resulting in the formation high resistive second phases at CIGS/rear electrode or work function mismatch at the interface) may be controlled by lowering a process temperature of the CIGS light absorption layer or introducing an interface material having excellent anti-diffusion ability and high work function between the CIGS and rear electrodes.

In addition, by replacing the rear electrode 30 with a thin film having excellent transmittance and applying a laser of a transmittable wavelength band, heat absorption may be focused to the CIGS thin film to cause separation of the interface of the CIGS and rear electrodes.

The rear electrode 30 may have a light absorptance of 20% or below in a visible or near infrared light band (a wavelength band of about 450 to 1100 nm) and a specific resistance of 1E-2 Ωcm or below. In addition, the rear electrode 30 may be formed to have a thickness of 100 to 2000 nm.

At this time, the rear electrode 30 may employ a transparent conductive oxide (TCO) such as an indium oxide (for example, ITO), a zinc oxide (for example, ZnO) and a tin oxide (for example, FTO), a three-layered TCO/metal/TCO structure, a carbon material such as graphene, or a material with low absorptance in a visible and near infrared light band. For example, if TCO is used for the rear electrode 30, light absorption in a visible wavelength band (with a wavelength of about 532 nm) is very small, but light absorption in a near-infrared to infrared wavelength band (about 1064 nm) is significantly high.

Meanwhile, the transparent substrate 10 has a transmittance of 90% or above in a visible or near infrared light band (a wavelength band of about 450 to about 1100 nm), and soda lime glass, polyimide or the like may be applied.

Therefore, in the first scribing process P1, TCO may be removed by using a laser of a near-infrared to infrared wavelength band (about 1064 nm), which is absorbable to a TCO layer, and in the second scribing process P2 and the third scribing process P3, TCO may be preserved and the CIGS layer or above may be removed by applying a laser of a visible wavelength band (about 532 nm).

At this time, an interface control substance 31 having a high work function is introduced between the CIGS light absorption layer 40 and the rear electrode 30 in order to prevent generation of interface products and facilitate hole injection into the CIGS light absorption layer 40 which is a p-type semiconductor.

The interface control substance 31 may be stable in about 400 to 600° C. and have a work function of 5 eV or above. For example, the interface control substance 31 may employ a molybdenum oxide, a tungsten oxide, a nickel oxide, a chrome oxide or the like, and its thickness may be controlled between about 1 nm and about 50 nm.

FIG. 4 is a diagram showing the first to third scribing processes P1, P2, P3 by heating using a substrate-incident laser. If the transparent substrate 10 employs a glass substrate, a laser of a visible to near-infrared wavelength (for example, about 1064 nm, about 532 nm) not absorbable to the glass substrate may be used.

In this case, if a visible wavelength (about 532 nm) is applied during the second and third scribing processes P2, P3, heat passes through the rear electrode 30 having substantially no visible band absorption and is focused on the CIGS surface which forms the light absorption layer 40 adjacent to the rear electrode 30, and by means of rapid thermal expansion, it is possible to easily guide interface separation between the rear electrode 30 and the light absorption layer 40 without melting. In the second scribing process P2, an interface material with a high work function may be removed together, and if it remains partially, the interface material is very thin, which results in insignificant increase of serial resistance.

However, a generally known transparent material having no visible band absorption has a high specific electric resistance in comparison to metal. For example, ITO, which has most excellent conductivity among TCO materials, has a specific resistance of about 1E-4 Ωcm, which is about 10 times in comparison to about 1E-5 Ωcm of an existing Mo rear electrode. This high resistance increases a series resistance of a solar cell module in addition to a series resistance due to a TCO layer serving as a window layer. Thus, to overcome this, the rear electrode should have an increased thickness, or a cell width should be designed very small.

Figure 5:
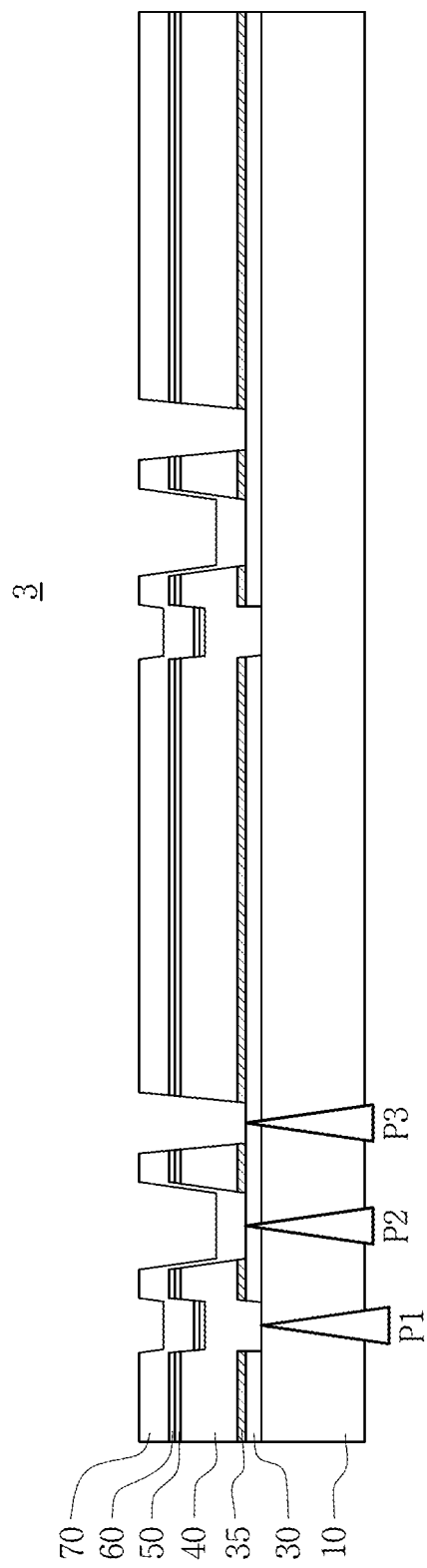
FIG. 5 is a cross-sectional view showing a thin film solar cell module structure having a multi-layered rear electrode composed of an electrode with excellent transmittance and an electrode allowing light absorption according to another embodiment of the present disclosure.

This problem can be solved if the double-layered rear electrode 30, 35 having a structure composed of a metal layer and a transparent material layer as shown in FIG. 5 is applied so that the metal layer serves as a high-conductive electrode and a sacrificial layer for laser scribing.

FIG. 5 is a cross-sectional view showing a thin film solar cell module structure having a multi-layered rear electrode composed of an electrode with excellent transmittance and an electrode allowing light absorption according to another embodiment of the present disclosure.

A thin film solar cell 3 according to the present disclosure includes a double-layered rear electrode composed of a first rear electrode 30 and a second rear electrode 35. The second rear electrode 35 is used as a sacrificial layer during the second scribing process P2 and the third scribing process P3.

The first rear electrode 30 may have a light absorptance of 20% or below in a visible or near infrared light band (a wavelength band of about 450 to 1100 nm) and a specific resistance of 1E-2 Ωcm or below. For example, the first rear electrode 30 may employ any one selected from the group consisting of a transparent conductive oxide (TCO) including at least one of an indium oxide (for example, ITO), a zinc oxide (for example, ZnO) and a tin oxide (for example, FTO), a multi-layered transparent structure composed of a TCO and a metal film or a nano-wire layer and a TCO, and a transparent electrode in which a carbon material having at least one of graphene and carbon nanotube is dispersed. In addition, the first rear electrode 30 may be formed to have a thickness of about 50 to about 1000 nm, preferably about 200 to about 500 nm.

The second rear electrode 35 may be configured so that a ratio of a light absorptance of the second rear electrode 35 to a light absorptance of the first rear electrode 30 may be more than 1 in a visible light or near infrared light band (a wavelength band of about 450 to 1100 nm). In other case, the second rear electrode 35 may have a light absorptance of 30% or above and a specific resistance of 5E-5 Ωcm or below. For example, the second rear electrode 35 may be formed with a single layer or multiple layers including at least one metal selected from molybdenum (Mo), tungsten (W), titanium (Ti), copper (Cu), gold (Au), silver (Ag), niobium (Nb) and nickel (Ni), and the second rear electrode 35 may be formed to have a thickness of about 10 to 1000 nm, preferably about 200 to about 500 nm.

For example, when a Mo/TCO double-layered rear electrode 35, 30 is used, if Mo is deposited to have a thickness of about 200 to about 500 nm, the resistance of the rear electrode may be greatly lowered, which solves the high resistance problem of the transparent electrode. In addition, by placing Mo, which is a traditional rear electrode material, on a rear surface of the CIGS, it is possible to solve process difficulty and efficiency deterioration caused by the replacement of a rear electrode with TCO.

As shown in FIG. 6, if a laser of a visible to near-infrared wavelength (about 1064 nm or about 532 nm) is applied, the Mo electrode layer 35 shows very high laser absorption in comparison to the TCO 30, which enables selective rapid heating of the Mo electrode layer 35. Accordingly, Mo/TCO interface separation is caused, which allows the second and third scribing processes P2, P3 to be performed easily. Since the metal layer 35 have significantly higher laser absorption capabilities than the TCO 30 all over visible light or infrared light band, it is likely to perform the first to third scribing processes P1, P2, P3 with single laser wavelength such as 1064 nm.

As shown in FIG. 5, since the Mo electrode layer 35 is removed during laser scribing, electric resistances in the P2 region and the P3 region increase. However, since the P2 and P3 regions have a very small width of about 10 μm to 200 μm, the increase of the series resistance due to the removal of the metal layer in the corresponding regions is limited. In addition, the increase of resistance may be minimized by depositing a front transparent electrode in the P2 region for series connection between adjacent cells and adjusting a scribing width in the P3 region.

FIGS. 7A to 7E show a process of manufacturing a module by using the metal layer 35 as a sacrificial layer during the second and third scribing processes P2 and P3, in the double-layered metal/transparent material rear electrode 30, 35 depicted in FIG. 5.

Figure 7A:
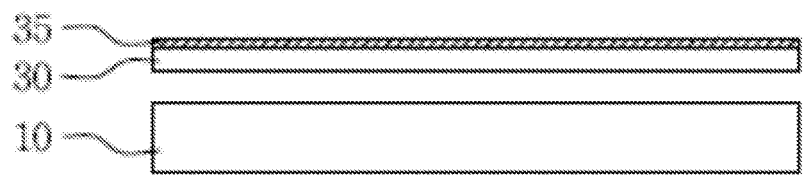
FIGS. 7A to 7E are cross-sectional views for illustrating a manufacturing method of a thin film solar cell module according to an embodiment of the present disclosure.

First, referring to FIG. 7A, a double-layered rear electrode 30, 35 is deposited on a first surface of the transparent substrate 10.

The transparent substrate 10 has a transmittance of 90% or above in a visible light or near infrared light band (a wavelength band of about 450 to about 1100 nm), and soda lime glass, polyimide or the like may be applied.

The first rear electrode 30 may have a light absorptance of 20% or below in a visible light or near infrared light band (a wavelength band of about 450 to 1100 nm) and a specific resistance of 1E-2 Ωcm or below. For example, the first rear electrode 30 may employ any one selected from the group consisting of a transparent conductive oxide (TCO) including at least one of an indium oxide (for example, ITO), a zinc oxide (for example, ZnO) and a tin oxide (for example, FTO), a multi-layered transparent structure composed of a TCO and a metal film or a nano-wire layer and a TCO, and a transparent electrode in which a carbon material having at least one of graphene and carbon nanotube is dispersed. In addition, the first rear electrode 30 may be formed to have a thickness of about 50 to about 1000 nm, preferably about 200 to about 500 nm.

The second rear electrode 35 may be configured so that a ratio of a light absorptance of the second rear electrode 35 to a light absorptance of the first rear electrode 30 is more than 1 in a visible light or near infrared light band (a wavelength band of about 450 to 1100 nm). In other case, the second rear electrode 35 may have a light absorptance of 30% or above and a specific resistance of 5E-5 Ωcm or below. For example, the second rear electrode 35 may be formed with a single layer or multiple layers including at least one metal selected from molybdenum (Mo), tungsten (W), titanium (Ti), copper (Cu), gold (Au), silver (Ag), niobium (Nb) and nickel (Ni), and the second rear electrode

35 may be formed to have a thickness of about 10 to 1000 nm, preferably about 200 to about 500 nm.

Figure 7B:
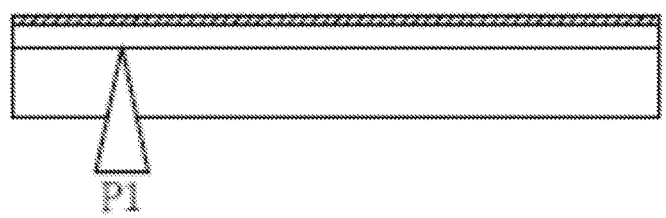

Referring to FIG. 7B, in order to remove the double-layered rear electrode 30, 35, namely in order to perform P1 patterning, the double-layered rear electrode 30, 35 is removed. At this time, a laser is input to a second surface (a rear surface) of the transparent substrate 10, instead of a first surface on which the double-layered rear electrode 30, 35 is deposited, to perform the scribing process.

At this time, a laser with a wavelength, which is absorbable to the double-layered rear electrode 30, 35 to be removed but not absorbable to the transparent substrate 10, may be input to the transparent substrate 10 so that the layer is separated from an interface due to a focused stress by abrupt thermal expansion, and thus scribing may be performed just with small energy. Accordingly, the double-layered rear electrode 30, 35 is separated at regular intervals in a first direction.

Figure 7C:
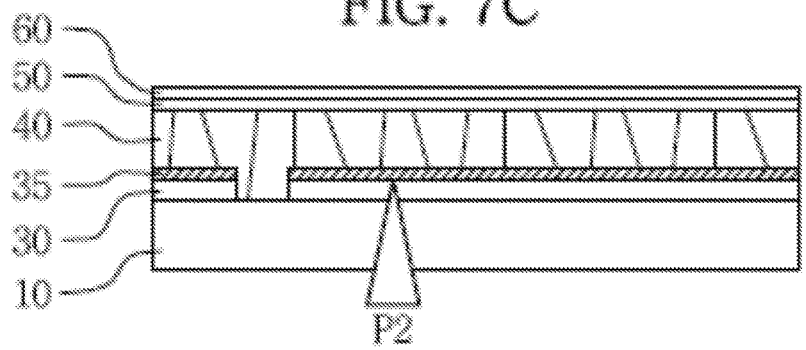

Referring to FIG. 7C, after the scribing process of the double-layered rear electrode 30, 35, a light absorption layer 40 is formed. The light absorption layer 40 is a Se-based or S-based light absorption layer made of $Cu(In_{1-x},Ga_x)(Se,S)_2$ (CIGS) or $Cu_2ZnSn(Se,S)_4$ (CZTS). For example, the light absorption layer 40 may include at least one of copper (Cu) and silver (Ag), at least one of indium (In), gallium (Ga), aluminum (Al), zinc (Zn) and tin (Sn), and at least one of selenium (Se) and sulfur (S).

In addition, at least one layer of a buffer layer 50 and a high-resistive window layer 60 may be deposited on the light absorption layer 40. After that, a second laser scribing process is performed to separate the light absorption layer 40. Similarly, a laser is input to the second surface (the rear surface) of the transparent substrate 10 in a substrate-incident manner, similar to the first laser scribing process, to perform a scribing process.

The second laser scribing process P2 may be performed in a region adjacent to the region where the first laser scribing process P1 is performed. Accordingly, the light absorption layer 40 and the at least one layer 50, 60 are separated in a region adjacent to the separation region of the double-layered rear electrode 30, 35. At this time, the second rear electrode 35 may be removed together since it is used as a sacrificial layer.

Figure 7D:
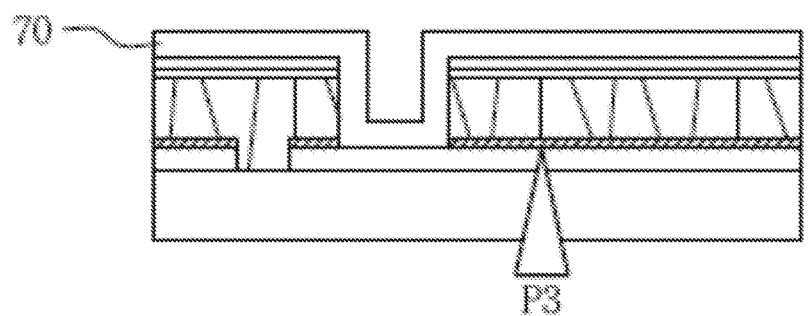
Figure 7E:
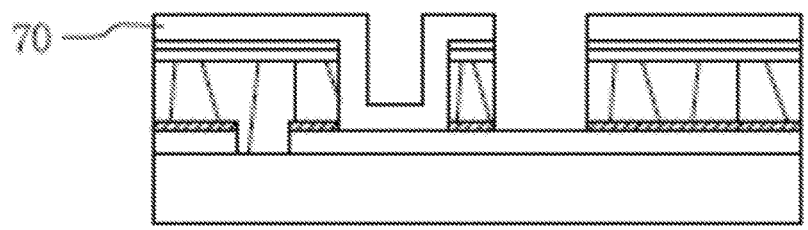

Referring to FIG. 7D, the transparent electrode 70 is deposited to connect the first rear electrode 30 to the transparent electrode 70 in a region where the second laser scribing process is performed. Accordingly, serial connection is performed between adjacent cells. After that, a laser is input to the second surface (the rear surface) of the transparent substrate 10 to perform a third laser scribing process. At this time, the second rear electrode 35 is used as a sacrificial layer, so that the second rear electrode 35 as well as the light absorption layer 40, the at least one layer 50, 60 and the transparent electrode 70 on the second rear electrode 35 are removed together. By doing so, referring to FIG. 7E, adjacent cells are electrically isolated and separated.

In the thin film photovoltaic module as described above, an additional fourth scribing process P4 may be easily applied after modularization, which allows free adjustment of light transmittance of the module. In addition, a line width and gap may be easily adjusted, and the module may serve as a skylight without any visual inconvenience. At this time, during the fourth scribing process P4, a laser may be input in a direction parallel to or perpendicular to the first to third scribing processes P1, P2, P3. In order to minimize photo-current loss resulting from the fourth scribing process P4, it may be applied perpendicular to the existing first to third scribing processes P1, P2, P3. By designing the fourth scribing process P4, it is possible to add various patterns or figures to the window-type BIPV.

In the metal/transparent material double-layered rear electrode 30, 35 formed on a glass substrate as described above, various colors may be implemented to the window-type BIPV module in view of indoor dwellers, by utilizing light reflection interference at a metal/transparent material interface, a transparent material/glass substrate interface and a glass substrate surface.

Hereinafter, the effects of the present disclosure are provided through experiments.

First, it was investigated how the replacement of Mo back electrode with ITO film influenced cell efficiency in a CIGS solar cell. When the ITO is applied as a rear electrode of a CIGS solar cell, in general an n-type $Ga_2O_3$ reactive layer is formed at ITO/CIGS interface producing high-resistive barrier at the interface and in turn a series resistance of the cell. In order to suppress formation of the $Ga_2O_3$ reactive layer, a CIGS film was deposited at a low temperature of about 450° C.

Figure 8:
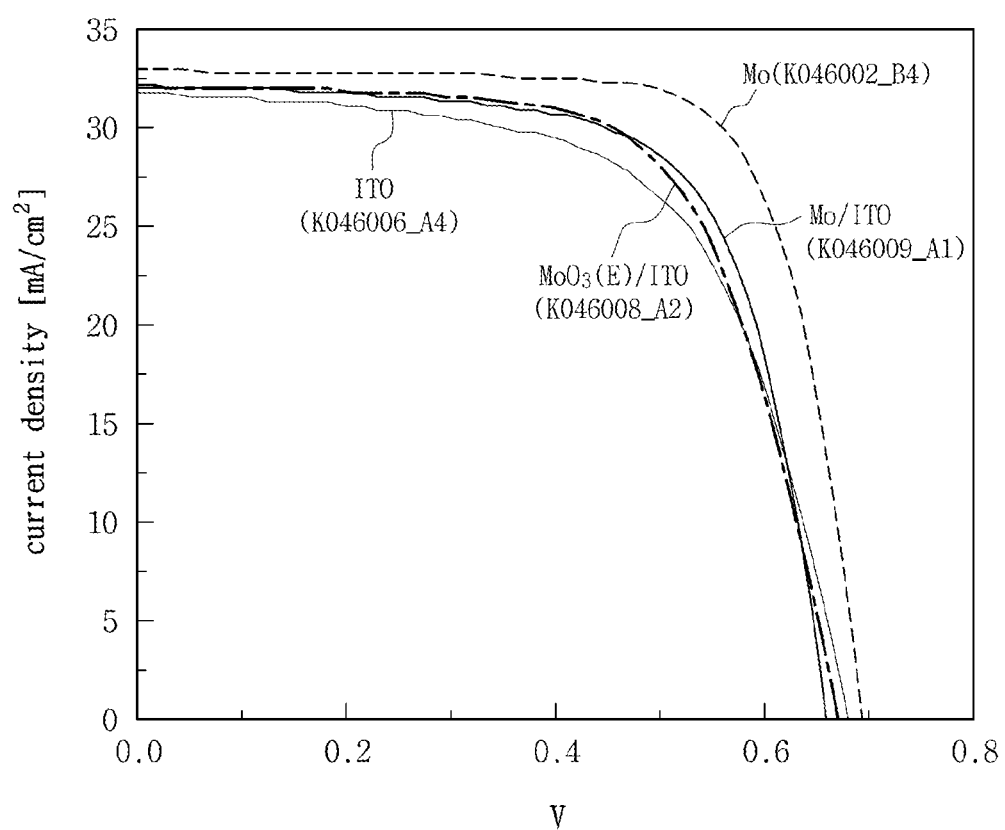
FIG. 8 is a light-applying current-voltage comparative curve of a solar cell, when a transparent conductive oxide ITO rear electrode is applied, in comparison to a Mo rear electrode.

CdS having a thickness of about 50 nm was deposited by means of chemical bath deposition (CBD), and sequentially high-resistive ZnO (about 50 nm in thickness) and Al-doped ZnO (AZO) (about 500 nm in thickness) was deposited by means of RF sputtering. As shown in Table 1 and FIG. 8, varying back contact electrodes were compared in terms of PCE of CIGS solar cells. Besides pure Mo or pure ITO back contact, several capping layers were added onto ITO. A $MoO_3$ layer having a high work function was deposited on ITO to suppress formation of an ITO/CIGS interface barrier due to work function mismatch between ITO and CIGS. A Mo film having a thickness of 200 nm was deposited on ITO to compensate a resistance of the ITO rear electrode.

TABLE 1

|  | efficiency [%] | $V_{OC}$ [mV] | $J_{SC}$ [mA/cm$^2$] | FF [%] |
|---|---|---|---|---|
| Mo | 16.8 | 694 | 32.9 | 73.8 |
| ITO | 13.2 | 680 | 31.7 | 61.5 |
| MoO$_3$/ITO | 14.1 | 671 | 32.0 | 65.4 |
| Mo/ITO | 14.4 | 659 | 32.1 | 67.9 |

When the ITO electrode is applied, FF deterioration is relatively severe due to the increase of resistance, in comparison with the case where a Mo electrode is applied to. The addition of $MoO_3$ film onto ITO back contact improved FF substantially. It means that, even though CIGS deposition is performed at low temperature, formation of a $Ga_2O_3$ reactive layer cannot be perfectly blocked, or an interface between CIGS and ITO materials does not maintain its ohmic contact. Meanwhile, FF was further improved by adding a Mo thin film to the transparent rear electrode. It means that the decrease of series resistance obtained by adding the Mo thin film may be a great advantage.

When the ITO rear electrode is used, it PCE is low, in comparison to the case where a Mo rear electrode is used. Its low efficiency can be explained by the scenario that Na impurity present in the substrate diffuses into the CIGS thin film during the CIGS deposition and in turn deteriorates the microstructure of the CIGS film. When a Na-free substrate is applied to the CIGS solar cell, its PCE may be recovered to the same level as the Mo rear electrode if other method for Na doping may be provided additionally.

Figure 9A:
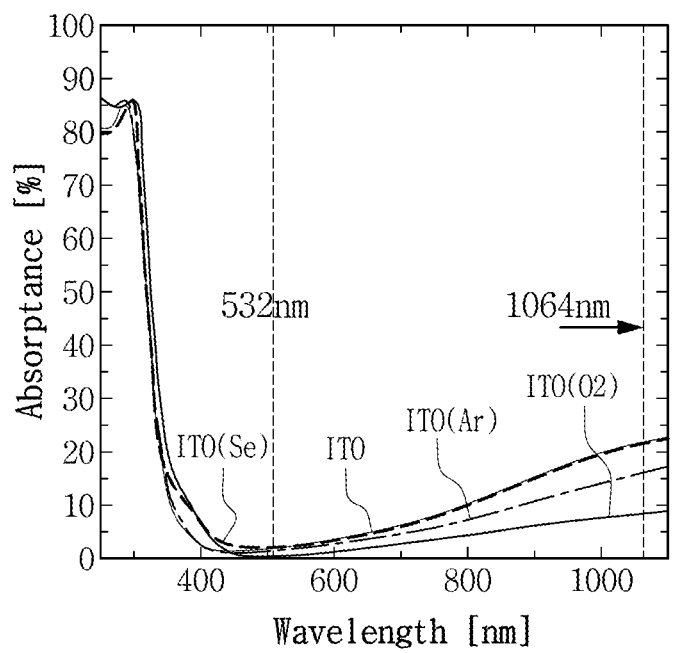
FIGS. 9A, 9B and 9C show spectrums variation of absorptance and reflectance of an ITO thin film and a Mo thin film according to each condition.
Figure 9B:
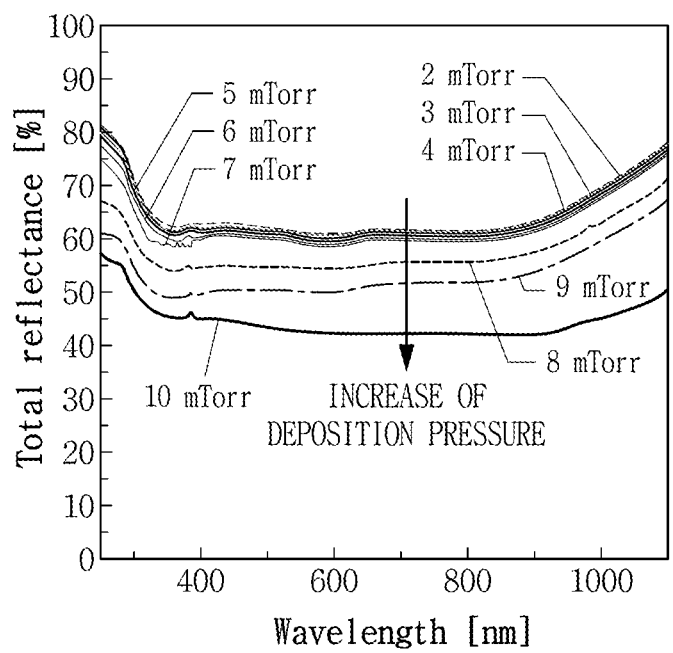
Figure 9C:
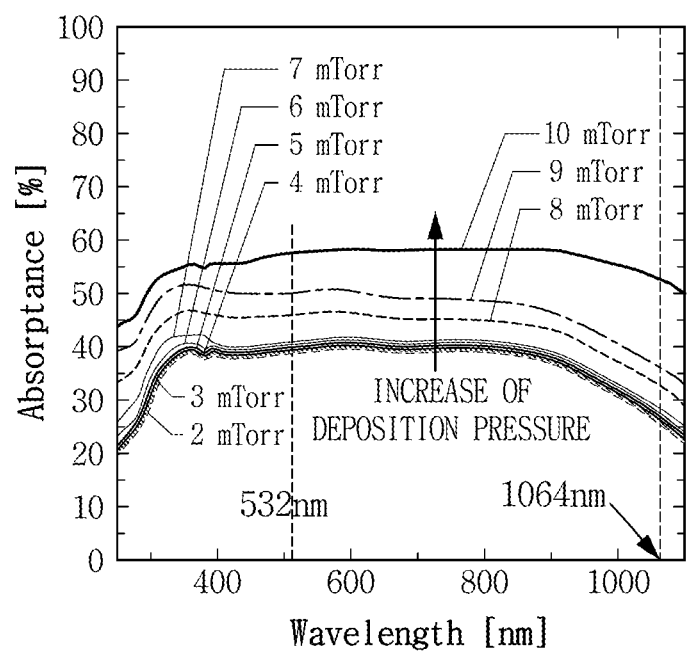

In addition, a light absorptance of the Mo thin film and the ITO thin film was evaluated. FIG. 9A shows absorptance spectrums of the ITO thin film according to the kind of an environment gas for thermal treatment. FIG. 9B shows reflectance spectrums (measured using an integrating sphere) the sputtered Mo thin film made at varying deposition pressure. FIG. 9C shows absorptance spectrums according to a deposition pressure of the sputtering Mo thin film.

As shown in FIG. 9A, the ITO has a very low absorptance of 2% or below in a short-wavelength band of 532 nm, but tends to have a greater absorptance as the wavelength increases. The absorptance may be reduced depending on a thermal treatment environment gas, and in case of an oxygen atmosphere, for example the absorptance was reduced from about 22% to about 8% at a wavelength of about 1064 nm. The Mo thin film was formed by means of sputtering deposition, and a microstructure of the thin film is greatly changed with a sputtering condition (for example, a deposition pressure). A dense microstructure was obtained at a low deposition pressure, but if the pressure increases beyond a certain level (here, 8 mTorr), micro pores existing grain boundaries and surface roughness increase together.

If the micro pores and surface roughness increase as described above, the absorptance is increased (FIG. 9C) while the reflectance is lowered (FIG. 9B). Since the increased surface roughness causes light reflection scattering, an integration sphere is used for accurate evaluation of reflected light. Depending on the microstructure of the Mo thin film, a light absorptance of about 40 to 60% (median value: about 50%) is obtained at a wavelength of about 532 nm, and a light absorptance of about 25 to 50% (median value: about 37%) is obtained at a wavelength of about 1064 nm.

In comparison to a light absorptance of the ITO thin film, the light absorptance of the Mo thin film is about 20 to 30 times (median value: about 25 times) at a wavelength of about 532 nm and about 1 to 6 times at a wavelength of about 1064 nm. Therefore, when scribing a Mo/ITO substrate with a laser having a wavelength of about 532 nm, a high selection ratio may be ensured between Mo and ITO, which allows easy development of the scribing technology as described previously. However, if a laser having a wavelength of about 1064 nm is applied, it is required to carefully adjust a Mo microstructure (in turn light absorptance), ITO characteristics and laser pulse time and intensity in order to increase a scribing selection ratio between Mo and ITO.

The CIGS photovoltaic module based on a glass substrate having a Mo/ITO rear electrode, proposed in the present disclosure, could provide excellent control over a color of the glass substrate because of strong interference between reflected lights at the ITO/glass interface and the Mo/ITO interface resulting from excellent transparency of ITO.

Figure 10:
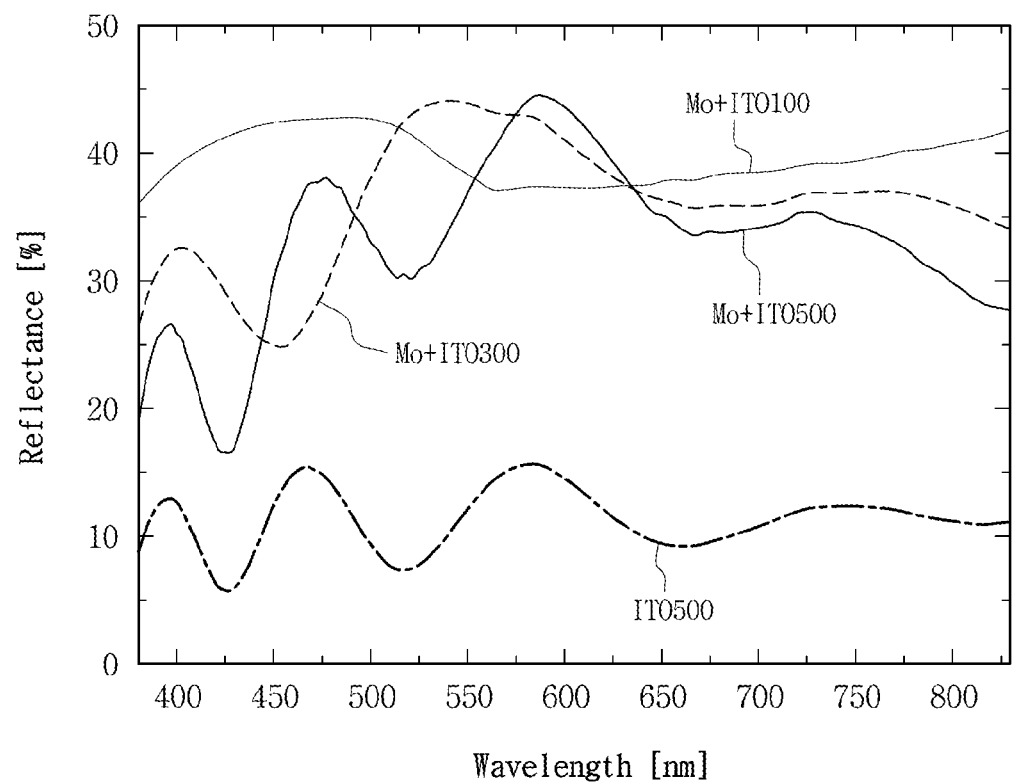
FIG. 10 shows a rear surface reflection spectrum of a substrate according to an ITO thickness of a solar cell module having Mo/ITO rear electrodes.

FIG. 10 shows a spectrum of reflected light calculated from a Mo/ITO rear electrode by an indoor light source. It can be found that, as the thickness of the ITO increases from 100, 300 to 500 nm, the spectrum varies greatly, and thus a reflection color may be adjusted in a wide color range.

If only the ITO is used, reflection at the CIGS/ITO interface is insufficient, and thus reflection intensity is very low, as shown in FIG. 10. However, if the double-layered Mo/ITO structure is applied, relative reflectance from the Mo/ITO interface increases, which results in a clearer reflection color. If this principle is applied to a transparent window photovoltaic module, it is possible to adjust a glass window color in various ways to maximize an aesthetic effect.

As mentioned above, in order to improve PCE of a monolithically integrated thin film solar module, line widths of the second and third scribing processes P2, P3 should be decreased to about 10 to 20 um to reduce a photovoltaic dead area. In addition, damages caused by melting the light absorption layer and/or surrounding materials during a scribing process and shunting among cells in the module caused by generated ridges/debris/burs should be prevented.

For the minimization of P2 and P3 line width, a laser-based scribing technique should be applied to the second and third scribing processes P2, P3. However, at present, a transparent window layer-incident method (in which a laser is incident to a film side of the substrate) is applied, and a very short pulse laser of a picosecond (ps) or lower level is applied to ensure heating selectivity between a region to be removed and a region to be preserved (i.e. the rear electrode). However, the pulse laser of picoseconds (ps) or the pulse laser of femtoseconds (fs) is expensive, which increases an initial investment of a photovoltaic module manufacturing process line.

In addition, if a laser of a transparent window layer-incident method is used, during the scribing process, the laser is input from a debris removing direction and interferes with the debris removal process. Often redundant particles or parts such as debris are adhered to a scribing region. Since a pulse laser of nanoseconds (ns), which is relatively inexpensive, may be successfully applied to a substrate-incident method as described here, it is possible to improve the module efficiency while minimizing the increase of manufacturing costs.

An amorphous Si solar cell having light transparency is now being fabricated in a way of removing a light absorption layer by means of laser scribing, to cope with a transparent window BIPV market. However, amorphous Si solar cell showed very low PCE and high manufacturing cost, thus its application being inevitably limited. Meanwhile, the conventional CIGS thin film solar module configured as shown in FIG. 1 cannot allow for light transmission over entire module area, and even through the regions P1, P2, P3 with part of constituent layers removed, since the light absorption layer has excellent light absorbing capability and Mo layer serving as a rear electrode performs light absorption or reflection. Since the CIGS thin film solar cell has very high PCE among existing thin film solar cell technology, a strong competitiveness may be ensured in the BIPV market, if light transparency is ensured.

The photovoltaic module for a transparent window as described above should allow adjustment of lighting in various ways for indoor dwellers and also allow color adjustment to cope with an aesthetic element. Leaving active control of lighting and coloring aside after a product is made, it is at least required to produce various products with adjusted lighting and colors, customized according to a demand of an orderer, during a producing stage. Therefore, the present disclosure, having the ability to cope with the varying demands, is expected to reduce costs in the manufacturing process and ensure competitiveness in the BIPV market.

Since an area for solar module installation is limited in building-integrated photovoltaic module (BIPV) applications and even the installations are performed in a distributed manner at a small scale, installation costs are significantly increased as compared with the price of the photovoltaic module. Therefore, rather than the price of the photovoltaic module, its high PCE may empower a more excellent competitiveness to the module.

The Se-based or S-based thin film solar cell is an early stage of commercialization due to high absorptance, excellent semiconductor characteristics, and excellent photovoltaic conversion efficiency, and is also expected to greatly increase its dominance in the future solar cell market. In addition, the thin film solar cell capable of providing special functions such as light transparency and flexibility may be applied to various fields with high added values such as a building-integrated photovoltaic module (BIPV).

The solar module including a material with excellent visible light band transmittance adjacent to the substrate, as proposed in the present disclosure, makes it possible to apply an inexpensive laser scribing technique to the fabrication of solar modules. Therefore, the present disclosure may be used for producing high-efficient low-cost Se-based or S-based thin film solar cell modules and may also be utilized in a transparent window BIPV field by easily ensuring light transparency. The present disclosure allows very high energy production in comparison to an amorphous Si thin film solar cell which is already being used as a transparent window.

What is claimed is:

1. A method for manufacturing a thin film solar cell, comprising:
    depositing a transparent first rear electrode on a first surface of a transparent substrate;
    depositing a second rear electrode including molybdenum (Mo) on the first rear electrode;
    performing a first laser scribing process which separates a double layer of the first and second rear electrodes by using a single wavelength of light;
    depositing a light absorption layer having selenium (Se) or sulfur (S) on the second rear electrode;
    performing a second laser scribing process by inputting a laser to a second surface of the transparent substrate, which is opposite to the first surface, to separate the light absorption layer;
    depositing a transparent electrode on the light absorption layer; and
    performing a third laser scribing process by inputting a second laser to the second surface to separate the transparent electrode.

2. The method for manufacturing a thin film solar cell according to claim 1,
    wherein, in the performing of the second laser scribing process and the performing of the third laser scribing process, the second rear electrode is used as a sacrificial layer for removing the layers subsequently placed on the second rear electrode.

3. The method for manufacturing a thin film solar cell according to claim 1,
    wherein the first rear electrode is made of a material having a light absorptance of 20% or below in a visible or near infrared light band and a specific resistance of 1E-2 $\Omega$cm or below.

4. The method for manufacturing a thin film solar cell according to claim 3,
    wherein the first rear electrode includes any one selected from the group consisting of a transparent conductive oxide (TCO) having at least one of an indium oxide, a zinc oxide and a tin oxide, a multilayered transparent electrode composed of a TCO and a metal film or a nano-wire layer and a TCO, and a transparent electrode in which a carbon material having at least one of graphene and carbon nanotube is dispersed.

5. The method for manufacturing a thin film solar cell according to claim 1,
    wherein the second rear electrode is made of a material having a specific resistance of 5E-5 $\Omega$cm or below and also having a wavelength band in which a ratio of a light absorptance of the second rear electrode to a light absorptance of the first rear electrode is more than 1 in a visible or near infrared light band.

6. The method for manufacturing a thin film solar cell according to claim 1,
    wherein the first rear electrode is formed to have a thickness of 50 to 1000 nm, and the second rear electrode is formed to have a thickness of 10 to 1000 nm.

7. The method for manufacturing a thin film solar cell according to claim 1,
    wherein the light absorption layer is made of a material including at least one of copper (Cu) and silver (Ag), at least one of indium (In), gallium (Ga), aluminum (Al), zinc (Zn) and tin (Sn), and at least one of selenium (Se) and sulfur (S).

8. The method for manufacturing a thin film solar cell according to claim 1, further comprising:
    depositing at least one of a buffer layer and a high-resistive window layer on the light absorption layer,
    wherein the at least one layer is removed together with the light absorption layer when the second laser scribing process is performed.

9. The method for manufacturing a thin film solar cell according to claim 1,
    wherein at a region of the first laser scribing processes, the substrate remains, and the first rear electrode and the second rear electrode are removed.

10. The method according to claim 9,
    wherein at a region of the second laser scribing process, the substrate and the first rear electrode remain, and the second rear electrode, the light absorption layer, the buffer layer, and the window layer are removed.

11. The method according to claim 10,
    wherein at a region of the third laser scribing process, the substrate and the first rear electrode remain, and the second rear electrode, the light absorption layer, the buffer layer, the window layer, and the transparent electrode are removed.

12. The method according to claim 1, further comprising depositing a buffer layer and a high-resistive window layer on the light absorption layer; and removing the buffer layer and the high-resistive window layer together with the light absorption layer.

13. A method for manufacturing a thin film solar cell, comprising:
    depositing a transparent rear electrode on a first surface of a transparent substrate;
    depositing an interface control substance including molybdenum oxide on the rear electrode;
    performing a first laser scribing process by using a single wavelength of light, which separates the transparent rear electrode and the interface control substance;
    depositing a light absorption layer having selenium (Se) or sulfur (S) on the interface control substance;
    performing a second laser scribing process by inputting a laser to a second surface of the transparent substrate, which is opposite to the first surface, to separate the light absorption layer;
    depositing a transparent electrode on the light absorption layer; and
    performing a third laser scribing process by inputting a second laser to the second surface to separate the transparent electrode.

14. The method for manufacturing a thin film solar cell according to claim 13,
    wherein the transparent rear electrode is made of a material having a light absorptance of 20% or below in a visible or near infrared light band and a specific resistance of 1E-2 Ωcm or below.

15. The method for manufacturing a thin film solar cell according to claim 14,
wherein the transparent rear electrode includes any one selected from the group consisting of a transparent conductive oxide (TCO) having at least one of an indium oxide, a zinc oxide and a tin oxide, a multilayered transparent electrode composed of a TCO and a metal film or a nano-wire layer and a TCO, and a transparent electrode in which a carbon material having at least one of graphene and carbon nanotube is dispersed.

16. The method for manufacturing a thin film solar cell according to claim 13,
wherein the interface control substance is made of a material which is stable at temperature of 400 to 600° C. and has a work function of 5 eV or above.

17. The method for manufacturing a thin film solar cell according to claim 13,
wherein the transparent rear electrode is formed to have a thickness of 100 to 2000 nm, and the interface control substance is formed to have a thickness of 1 to 50 nm.

18. The method for manufacturing a thin film solar cell according to claim 13,
wherein the light absorption layer is made of a material including at least one of copper (Cu) and silver (Ag), at least one of indium (In), gallium (Ga), aluminum (Al), zinc (Zn) and tin (Sn), and at least one of selenium (Se) and sulfur (S).

19. The method for manufacturing a thin film solar cell according to claim 13, further comprising:
depositing at least one of a buffer layer and a high-resistive window layer on the light absorption layer,
wherein the at least one layer is removed together with the light absorption layer when the second laser scribing process is performed.

* * * * *